(12) United States Patent
Kang et al.

(10) Patent No.: US 10,043,860 B2
(45) Date of Patent: Aug. 7, 2018

(54) DISPLAY DEVICE AND METHOD OF MANUFACTURING THE SAME

(71) Applicant: SAMSUNG DISPLAY CO., LTD., Yongin-si, Gyeonggi-do (KR)

(72) Inventors: Byung Hoon Kang, Hwaseong-si (KR); Kwang Suk Kim, Suwon-si (KR); Joon-Hwa Bae, Suwon-si (KR); Woo Jin Cho, Yongin-si (KR); Hyun Jin Cho, Seoul (KR); Jun Hyuk Cheon, Seoul (KR); Byoung Kwon Choo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/605,431

(22) Filed: May 25, 2017

(65) Prior Publication Data

US 2018/0114819 A1    Apr. 26, 2018

(30) Foreign Application Priority Data

Oct. 20, 2016   (KR) .................. 10-2016-0136709

(51) Int. Cl.
*H01L 29/08* (2006.01)
*H01L 27/32* (2006.01)

(52) U.S. Cl.
CPC ...... *H01L 27/3248* (2013.01); *H01L 27/3276* (2013.01); *H01L 2227/323* (2013.01)

(58) Field of Classification Search
CPC ............... H01L 27/124; H01L 27/1255; H01L 29/78621; H01L 27/3248; H01L 27/3276; H01L 2227/323

USPC ................... 257/40, 43, 200, 22; 349/39, 43
See application file for complete search history.

(56) References Cited

U.S. PATENT DOCUMENTS

| 5,169,491 | A | 12/1992 | Doan |
| 6,545,299 | B1 | 4/2003 | Peterson et al. |
| 7,767,583 | B2 | 8/2010 | Ramappa et al. |
| 8,658,458 | B2 | 2/2014 | Graff |
| 9,601,635 | B2 * | 3/2017 | Yamazaki |
| 9,685,461 | B2 * | 6/2017 | Yuan ................... H01L 27/1225 |
| 9,705,002 | B2 * | 7/2017 | Yamazaki ........... H01L 27/1255 |

(Continued)

FOREIGN PATENT DOCUMENTS

| KR | 10-1998-0054478 A | 9/1998 |
| KR | 10-2004-0007872 A | 1/2004 |

*Primary Examiner* — Mohammed Shamsuzzaman
(74) *Attorney, Agent, or Firm* — Lewis Roca Rothgerber Christie LLP

(57) ABSTRACT

A method of manufacturing a display device includes: forming an active layer on a substrate; forming a first insulation layer covering the active layer; forming a gate metal line on the first insulation layer; forming a third insulation layer covering the gate metal line and including a silicon oxide; forming a fourth insulation layer including a silicon nitride on the third insulation layer; forming a fifth insulation layer including a silicon oxide on the fourth insulation layer; arranging a blocking member over a region in which the active layer and the gate metal line overlap; forming a fifth auxiliary insulation layer by doping nitrogen ions in the fifth insulation layer; and exposing a part of an upper surface of the fourth insulation layer by removing a portion of a fifth main insulation layer of the fifth insulation layer which does not overlap the fifth auxiliary insulation layer.

5 Claims, 10 Drawing Sheets

(56) References Cited

U.S. PATENT DOCUMENTS

| | | | |
|---|---|---|---|
| 9,893,202 B2* | 2/2018 | Koezuka | H01L 29/7869 |
| 2004/0109101 A1* | 6/2004 | Kim | G02F 1/136209 |
| | | | 349/44 |
| 2004/0135173 A1* | 7/2004 | Choi | H01L 27/3276 |
| | | | 257/200 |
| 2005/0127828 A1* | 6/2005 | Chung | H01L 51/5203 |
| | | | 313/504 |
| 2006/0060858 A1* | 3/2006 | Park | H01L 27/1214 |
| | | | 257/66 |
| 2007/0002201 A1* | 1/2007 | You | G02F 1/1368 |
| | | | 349/43 |
| 2009/0147165 A1* | 6/2009 | Kim | H01L 27/1255 |
| | | | 349/39 |
| 2011/0001137 A1* | 1/2011 | Yoon | H01L 27/1214 |
| | | | 257/43 |
| 2014/0138671 A1* | 5/2014 | Lee | H01L 29/66969 |
| | | | 257/43 |
| 2015/0325705 A1* | 11/2015 | Choi | G02F 1/134363 |
| | | | 257/72 |
| 2016/0027887 A1* | 1/2016 | Yuan | H01L 29/78696 |
| | | | 257/43 |
| 2017/0236844 A1* | 8/2017 | Yamazaki | H01L 27/1225 |
| | | | 257/43 |
| 2017/0271520 A1* | 9/2017 | Yamazaki | H01L 29/7869 |

* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2016-0136709, filed on Oct. 20, 2016 in the Korean Intellectual Property Office, the entire content of which is incorporated herein by reference.

BACKGROUND

1. Field

Aspects of embodiments of the present disclosure relate to a display device and a method of manufacturing the same.

2. Description of the Related Art

Display devices include a liquid crystal display (LCD), a plasma display panel (PDP), an organic light emitting diode (OLED) display, a field emission display (FED), and an electrophoretic display device. Generally, in the display device, a plurality of transistors and one or more capacitors are included in one pixel. The transistor and the capacitor include a plurality of lines and an insulation layer. When resolution of the display device is increased, a size of the pixel is decreased. In the high-resolution display device, many lines are disposed in a narrow space, such that an area having a large step between the lines within the pixel is generated. In this case, when a photolithography process is performed, a pattern defect of the line is easily generated due to a pattern defect of a photosensitive film.

The above information disclosed in this Background section is only for enhancement of understanding of the background of the invention and therefore it may contain information that does not form the prior art that is already known in this country to a person of ordinary skill in the art.

SUMMARY

According to an aspect of the present disclosure, a display device is capable of implementing high resolution, and a method of manufacturing the same is provided.

According to one or more exemplary embodiments of the present disclosure, a method of manufacturing a display device includes: forming an active layer on a substrate; forming a first insulation layer which covers the active layer; forming a gate metal line on the first insulation layer; forming a third insulation layer which covers the gate metal line and includes a silicon oxide; forming a fourth insulation layer, which includes a silicon nitride, on the third insulation layer; forming a fifth insulation layer, which includes a silicon oxide, on the fourth insulation layer; arranging a blocking member over a region in which the active layer and the gate metal line overlap; forming a fifth auxiliary insulation layer in a part of the fifth insulation layer by doping nitrogen ions in the fifth insulation layer and using the blocking member as a mask; removing the blocking member, and exposing a part of an upper surface of the fourth insulation layer by removing a portion of a fifth main insulation layer of the fifth insulation layer which does not overlap the fifth auxiliary insulation layer, by using a polishing device. The removing the portion of the fifth main insulation layer may include polishing the portion of the fifth main insulation layer using a polishing device.

The fifth auxiliary insulation layer may be positioned on an upper portion within the fifth insulation layer, and the fifth main insulation layer may be positioned on a lower portion within the fifth insulation layer.

The blocking member may include a photosensitive film pattern, or the blocking member may include a shadow mask.

The fifth auxiliary insulation layer may not be formed over the region in which the active layer and the gate metal line overlap.

An upper surface of the fifth main insulation layer may be positioned on a same horizontal surface as that of a part of an upper surface of the fourth insulation layer by polishing the fifth main insulation layer.

The forming of the gate metal line may include: forming a first gate metal line on the first insulation layer; forming a second insulation layer covering the first gate metal line; and forming a second gate metal line, which partially overlaps the first gate metal line, on the second insulation layer, and the blocking member may be positioned over a portion in which the active layer and the first gate metal line overlap.

The blocking member may be positioned in a portion, in which the active layer, the first gate metal line, and the second gate metal line overlap.

The method may further include: forming a data metal line on the fifth auxiliary insulation layer; forming a passivation layer covering the data metal line; forming a first electrode on the passivation layer; forming an emission layer on the first electrode; and forming a second electrode on the emission layer, and the passivation layer is in contact with a region of the fifth main insulation layer in which the fifth auxiliary insulation layer is not positioned.

According to another exemplary embodiment of the present disclosure, a display device includes: a substrate; an active layer on the substrate; a first insulation layer covering the active layer; a first gate metal line positioned on the first insulation layer; a third insulation layer which covers the first gate metal line and includes a silicon oxide; a fourth insulation layer, which is positioned on the third insulation layer and includes a silicon nitride; a fifth main insulation layer, which is positioned on the fourth insulation layer and includes a silicon oxide; and a fifth auxiliary insulation layer, which is positioned on a part of the fifth main insulation layer and includes a silicon nitride, in which an upper surface of the fifth main insulation layer is positioned on a same horizontal surface as that of a part of an upper surface of the fourth insulation layer, and the fifth auxiliary insulation layer is not positioned over a region in which the active layer and the first gate metal line overlap.

A thickness of the fifth auxiliary insulation layer may be less than a thickness of the fourth insulation layer.

A content of nitrogen may be increased from a lower portion to an upper portion inside the fifth auxiliary insulation layer.

A distance from an upper surface of the substrate to the upper surface of the fifth main insulation layer may be the same as a distance from the upper surface of the substrate to an upper surface of the fifth auxiliary insulation layer.

The display device may further include: a second insulation layer covering the first gate metal line; and a second gate metal line, which is positioned between the second insulation layer and the third insulation layer and overlaps the first gate metal line, in which the fifth auxiliary insulation layer is not positioned over a region in which the active layer, the first gate metal line, and the second gate metal line overlap.

The display device may further include: a data metal line positioned on the fifth auxiliary insulation layer; a passivation layer covering the data metal line; a first electrode positioned on the passivation layer; an emission layer positioned on the first electrode; and a second electrode formed on the emission layer, in which the passivation layer is in contact with the fifth main insulation layer, in which the fifth auxiliary insulation layer is not positioned.

According to an aspect of one or more embodiments, it is possible to minimize or reduce a short circuit phenomenon between data metal lines positioned on an insulation layer by planarizing the insulation layer covering the gate metal line in a high-resolution structure. Further, it is possible to easily pattern the data metal line.

According to an aspect of one or more embodiments, it is possible to easily manufacture a display device having high resolution.

DESCRIPTION OF SYMBOLS

Figure 1:
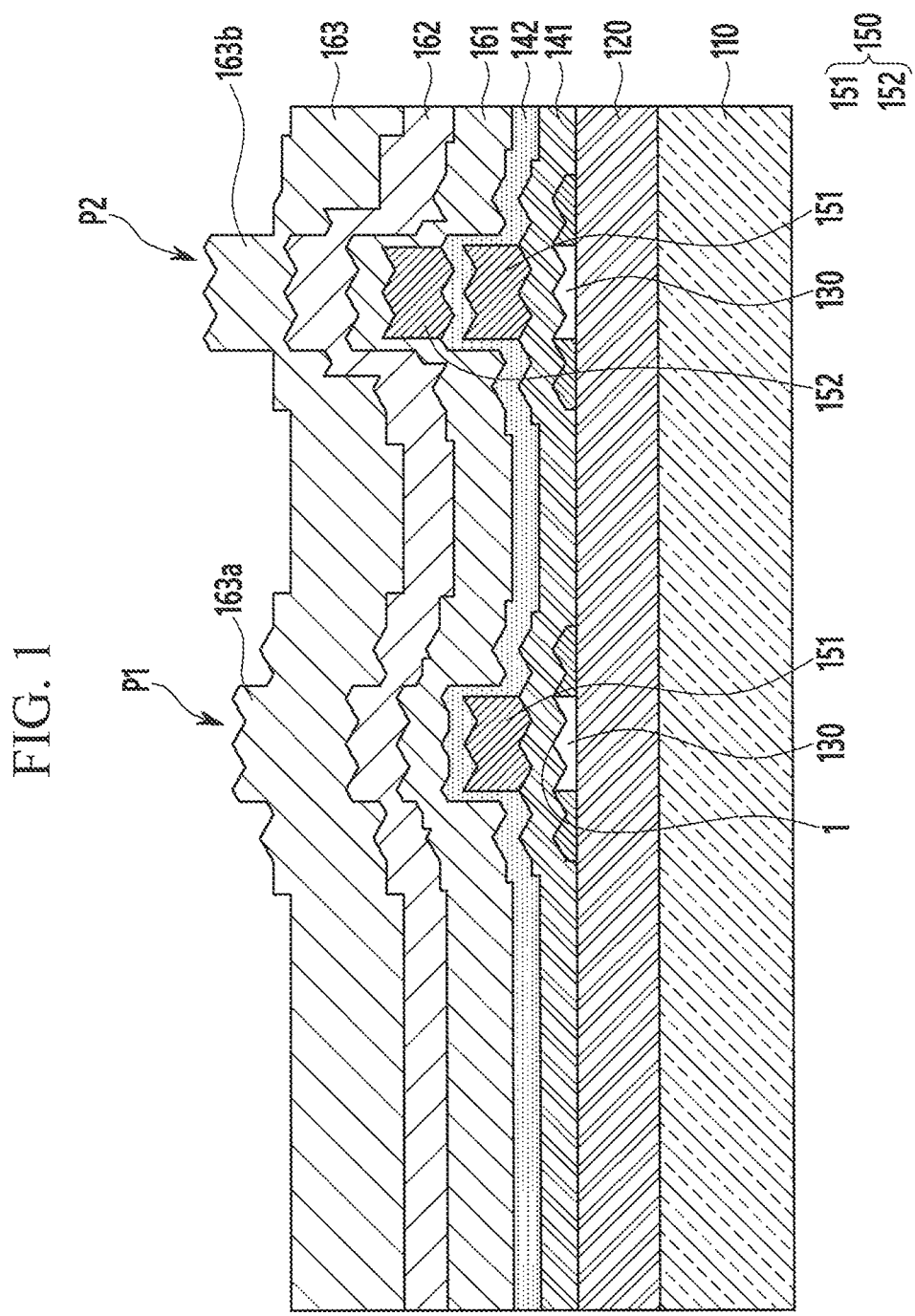
FIG. 1 is a cross-sectional view illustrating an operation of a method of manufacturing a display device according to an exemplary embodiment.

| | |
|---|---|
| 1: Protrusion | 10: Nitrogen ion |
| 51: Slurry | 110: Substrate |
| 130: Active layer | 141: First gate insulation layer |
| 142: Second insulation layer | 151: First gate metal line |
| 152: Second gate metal line | 161: Third insulation layer |
| 162: Fourth insulation layer | 163: Fifth insulation layer |
| 1631: Fifth main insulation layer | 1632: Fifth auxiliary insulation layer |
| 163a: First protruding portion | 163b: Second protruding portion |
| 171: Data metal line | |

DETAILED DESCRIPTION

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure.

In describing the present disclosure, parts that are not related to the description will be omitted. Like reference numerals generally designate like elements throughout the specification.

In addition, the size and thickness of each element shown in the drawings may be arbitrarily shown for understanding and ease of description, but the present disclosure is not limited thereto.

In the drawings, the thicknesses of layers, films, panels, regions, etc., may be exaggerated for clarity. In the drawings, for convenience of the description, thicknesses of some layers and areas may be exaggerated.

In the specification, unless explicitly described to the contrary, the word "comprise" and variations such as "comprises" or "comprising," are to be understood to imply the further inclusion of other elements. Further, in the specification, it will be understood that when an element, such as a layer, a film, a region, or a substrate is referred to as being "over" or "on" another element, it can be directly on the other element or intervening elements may also be present. Further, words such as "over" and "on" mean positioning on or below the object portion, but do not necessarily mean positioning on the upper side of the object portion based on a gravity direction.

Further, throughout the specification, the term "according to a plane" refers to a case in which a target portion is viewed from the above, and the term "according to a cross section" refers to a case in which a cross section taken by vertically cutting a target portion is viewed from the side.

Further, a display device may include a plurality of transistors and one or more capacitors in one pixel, and a separate wire may be further formed or an existing wire may be omitted, such that the display device may also be formed to have various structures. Here, the pixel refers to a minimum unit displaying an image, and the display device displays an image through the plurality of pixels.

Herein, a method of manufacturing a display device according to an exemplary embodiment will be described in further detail with reference to FIGS. 1 to 8.

Figure 2:
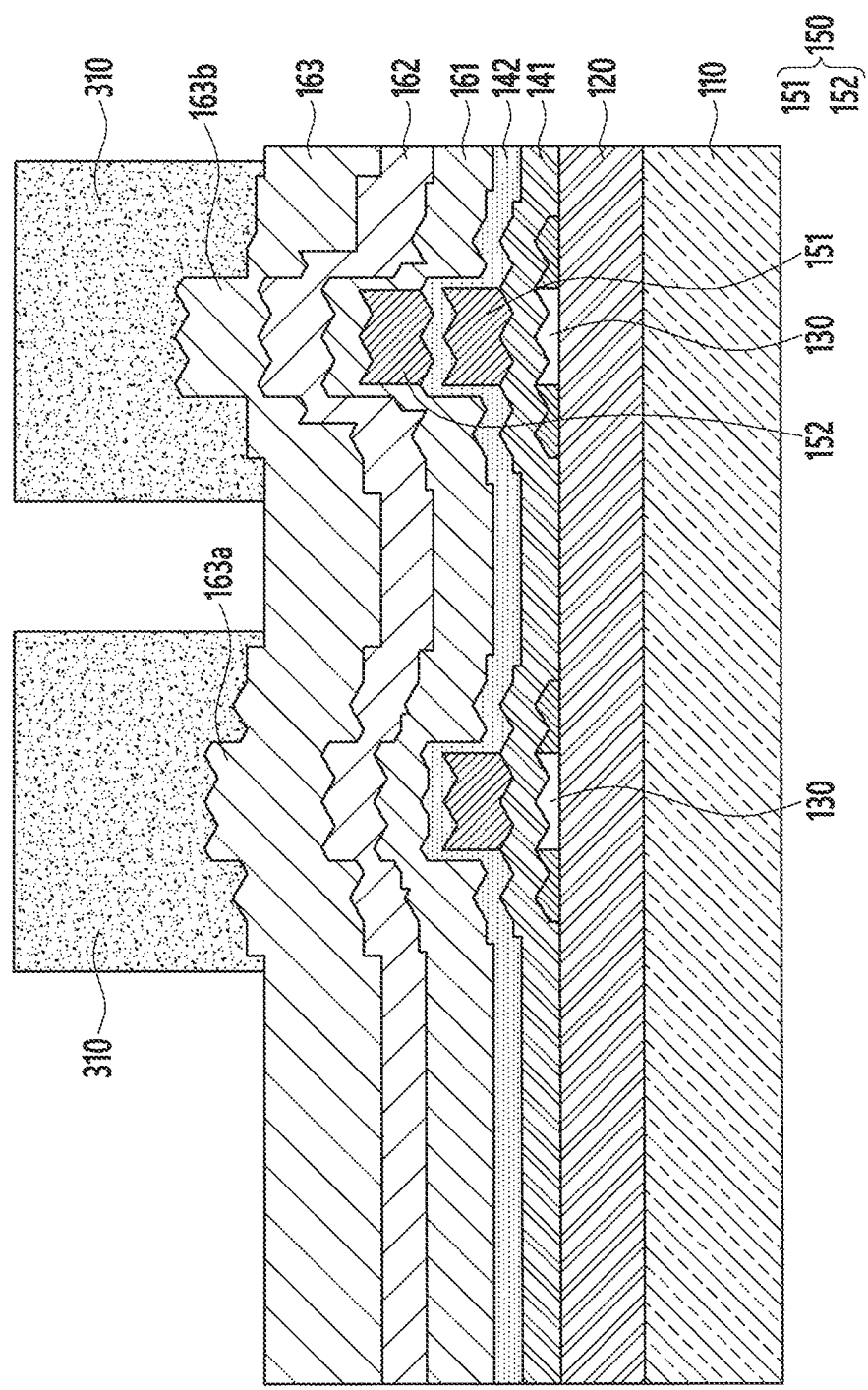
FIG. 2 is a diagram illustrating a next operation of the operation of FIG. 1.
Figure 3:
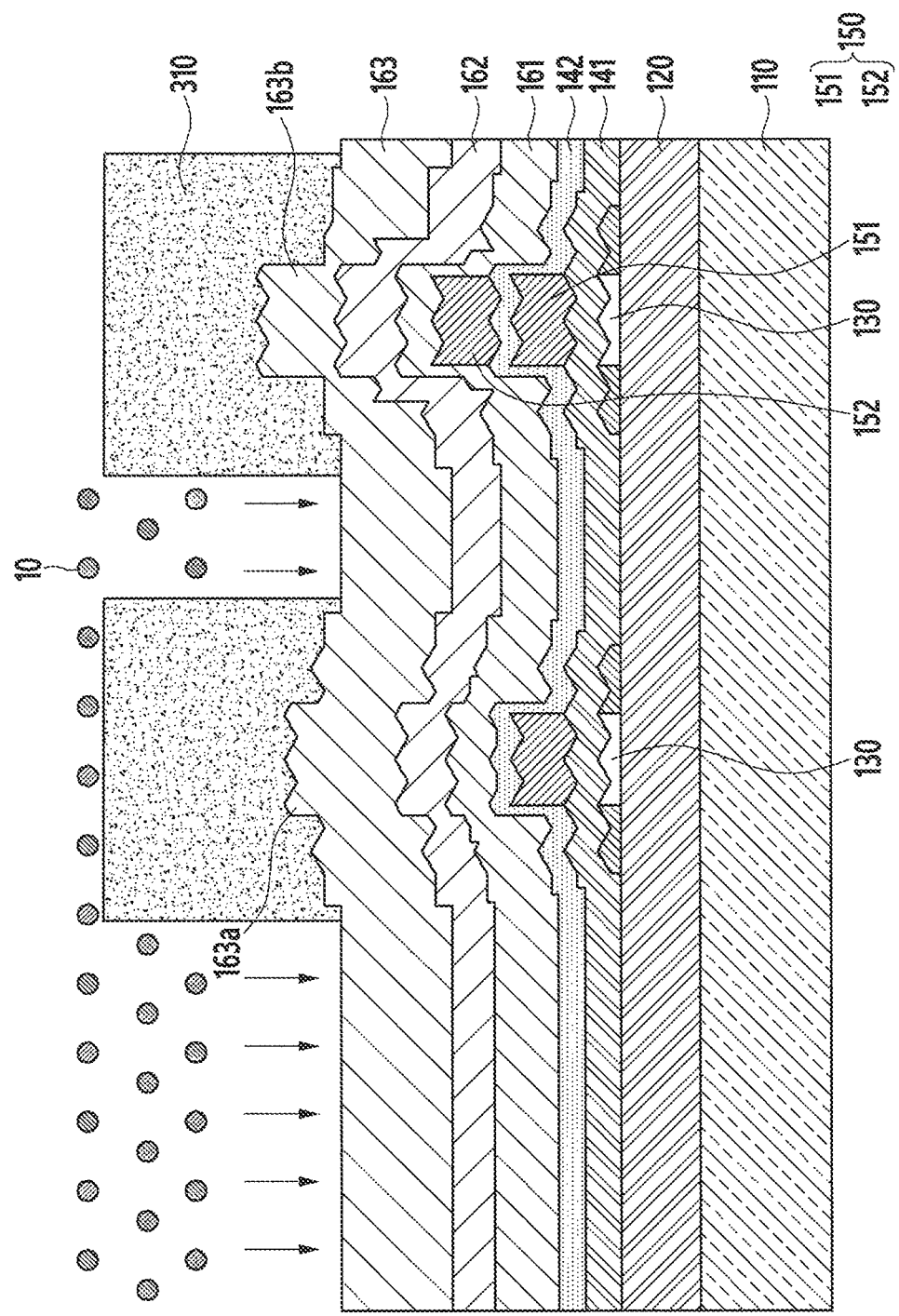
FIG. 3 is a diagram illustrating a next operation of the operation of FIG. 2.
Figure 4:
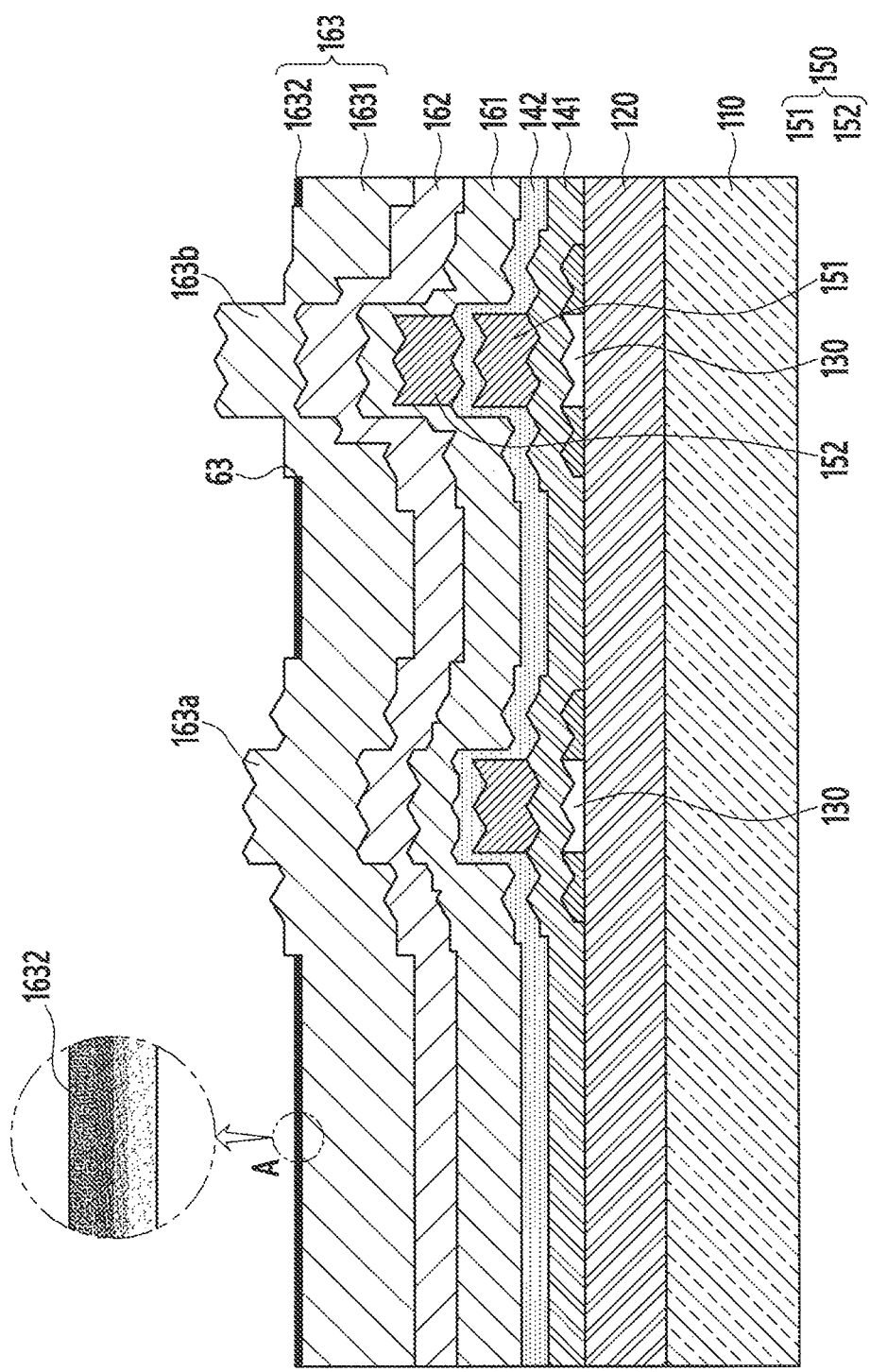
FIG. 4 is a diagram illustrating a next operation of the operation of FIG. 3.
Figure 5:
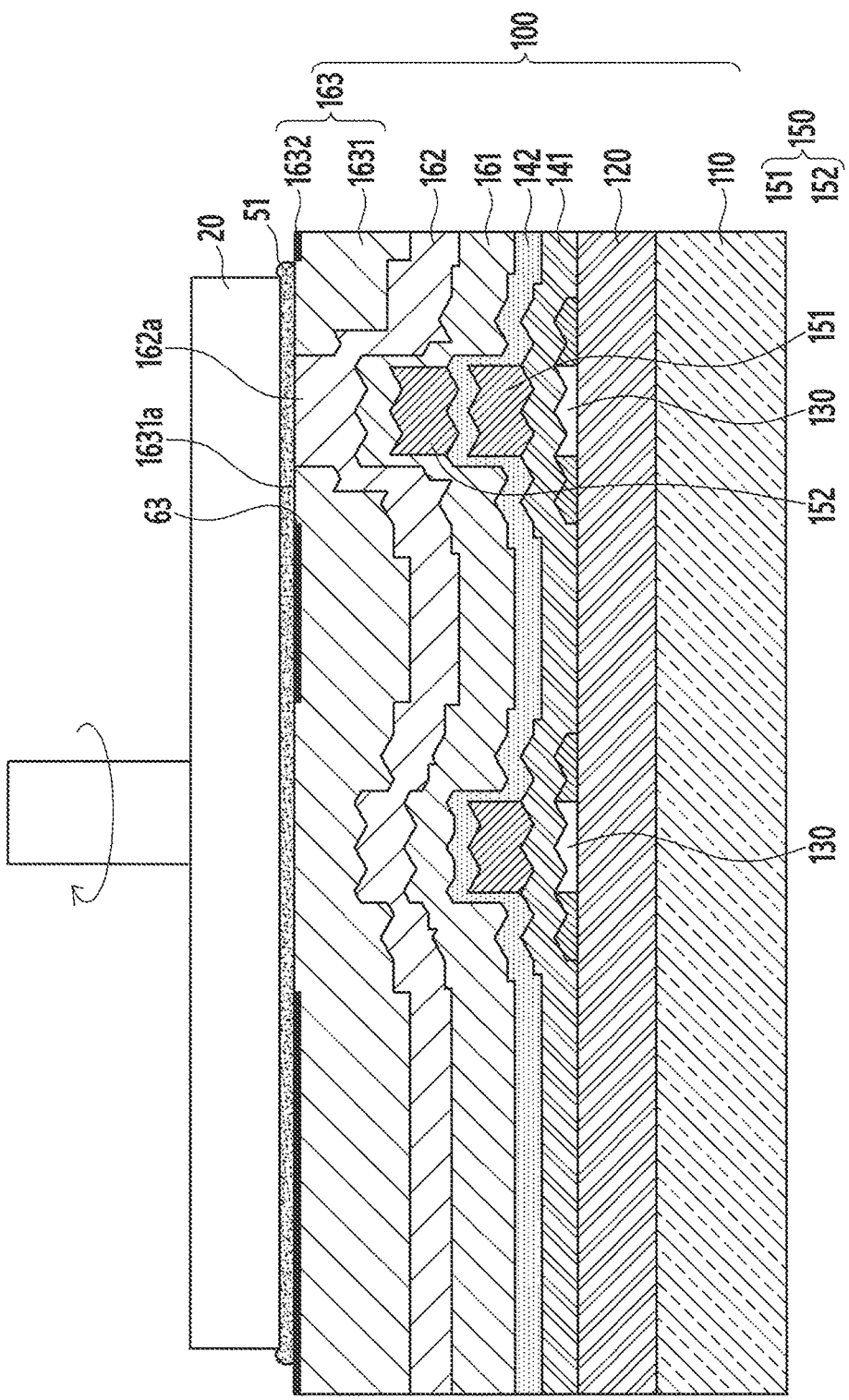
FIG. 5 is a diagram illustrating a next operation of the operation of FIG. 4.
Figure 6:
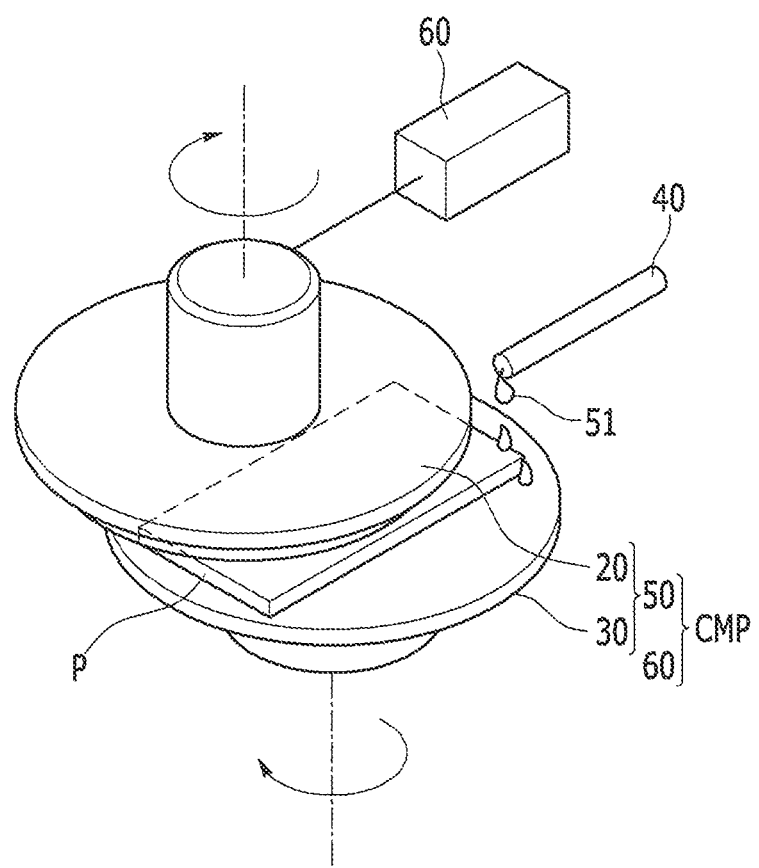
FIG. 6 is a schematic perspective view of a polishing device used in a method of manufacturing a display device according to an exemplary embodiment.
Figure 7:
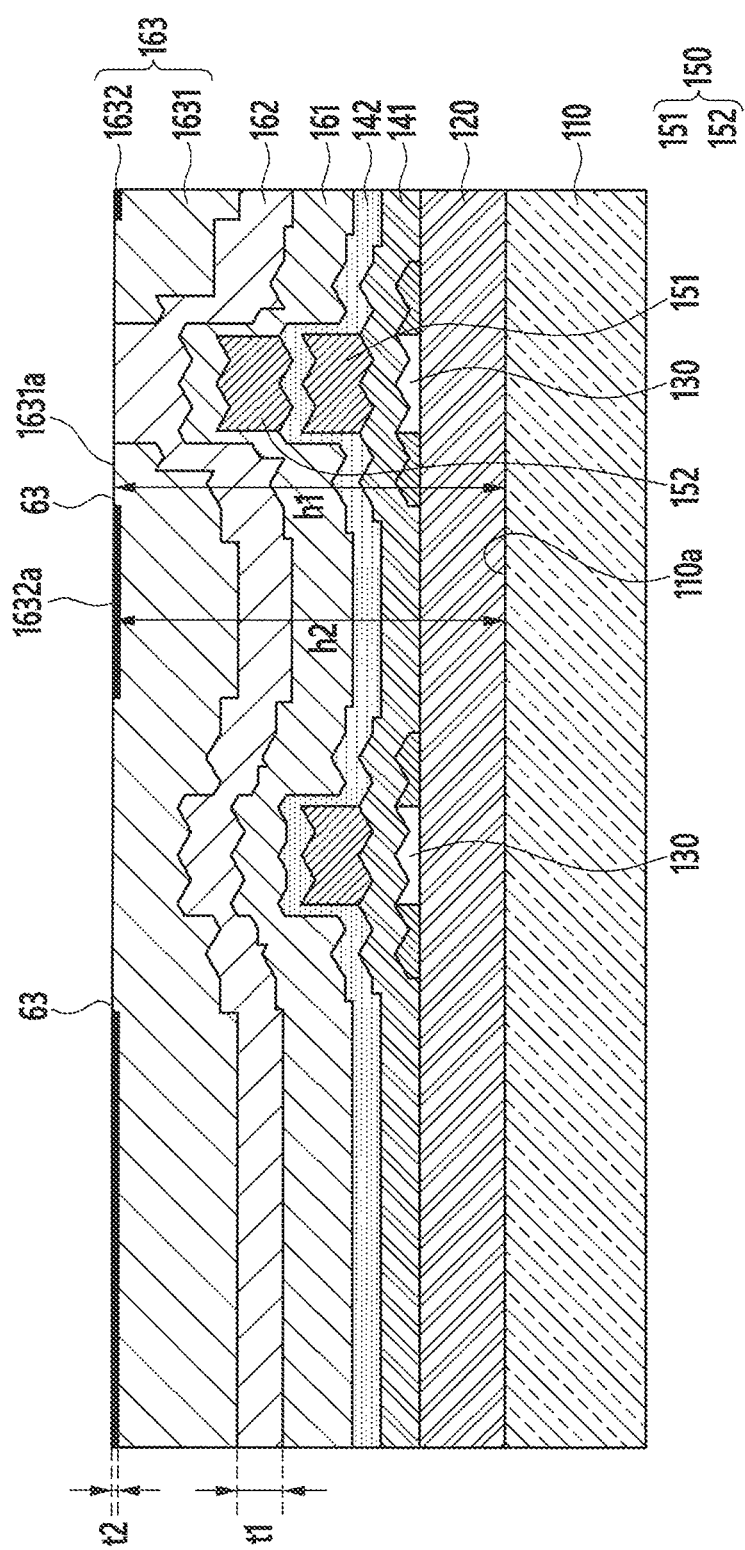
FIG. 7 is a diagram illustrating a next operation of the operation of FIG. 5.
Figure 8:
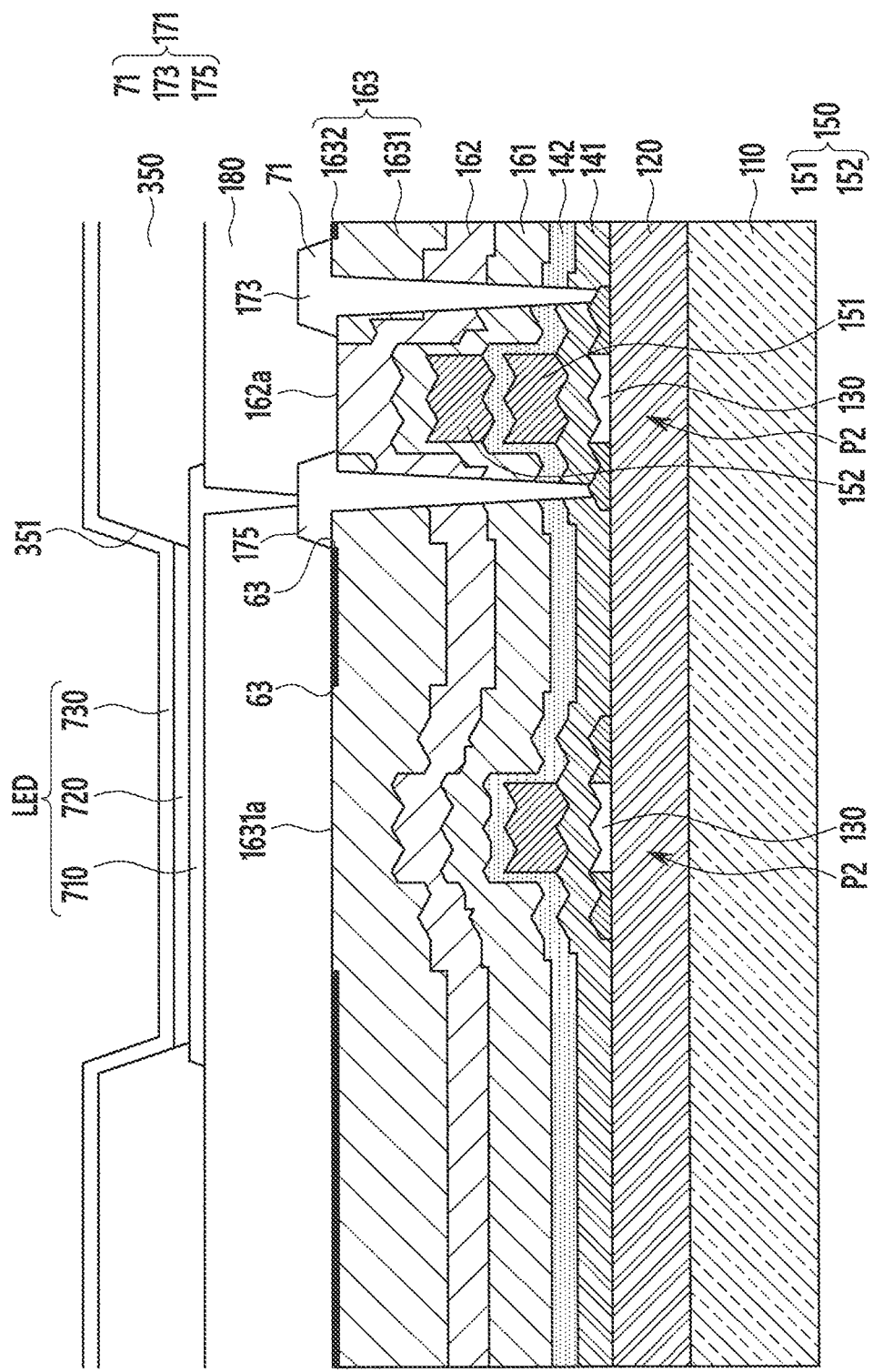
FIG. 8 is a cross-sectional view of a display device according to an exemplary embodiment.

FIG. 1 is a cross-sectional view illustrating an operation of a method of manufacturing a display device according to an exemplary embodiment; FIG. 2 is a diagram illustrating a next operation of the operation of FIG. 1; FIG. 3 is a diagram illustrating a next operation of the operation of FIG. 2; FIG. 4 is a diagram illustrating a next operation of the operation of FIG. 3; FIG. 5 is a diagram illustrating a next operation of the operation of FIG. 4; FIG. 6 is a schematic perspective view of a polishing device used in a method of manufacturing a display device according to an exemplary embodiment; FIG. 7 is a diagram illustrating a next operation of the operation of FIG. 5; and FIG. 8 is a cross-sectional view of a display device according to an exemplary embodiment.

As illustrated in FIG. 1, a buffer layer 120 is formed on a substrate 110, and an active layer 130 is formed on the buffer layer 120. The buffer layer 120 serves to block impurities from the substrate 110 and improve a characteristic of a polycrystalline silicon layer during a laser crystallization process for forming the polycrystalline silicon layer, and planarize the substrate 110 and relieve stress of the active layer 130 formed on the buffer layer 120. The buffer layer 120 may be formed of a silicon nitride (SiNx) or a silicon oxide (SiOx). The active layer 130 is formed of a polycrystalline silicon layer by forming an amorphous silicon layer and then crystallizing the amorphous silicon layer by using a laser crystallization process. The amorphous silicon layer may be formed by any of various methods, such as a low-pressure chemical vapor deposition method, an atmospheric pressure chemical vapor deposition method, a plasma enhanced chemical vapor deposition method, a sputtering method, a vacuum evaporation method, or an excimer laser annealing (ELA) method. When the active layer 130 is crystallized by using the ELA method using a laser beam having high energy, unintended protrusions 1 are generated in a grain boundary of the active layer 130. That is, the amorphous silicon layer melted by the laser beam is re-crystallized based on a grain, such that the protrusions 1 are generated in the grain boundary that is a boundary between the grains.

Then, a first insulation layer 141 covering the active layer 130 is formed on the active layer 130. In an embodiment, the first insulation layer 141 may be formed of silicon oxide (SiOx) or silicon nitride (SiNx).

Further, a first gate metal line 151 is formed on the first insulation layer 141. The first gate metal line 151 may be formed while overlapping (e.g., partially overlapping) the active layer 130. In an embodiment, the first gate metal line 151 may include a metal selected from molybdenum (Mo), a molybdenum alloy, copper (Cu), a copper alloy, aluminum (Al), and an aluminum alloy.

In an embodiment, a second insulation layer 142 covering the first gate metal line 151 is formed. The second insulation layer 142 may be formed of silicon oxide (SiOx) or silicon nitride (SiNx).

In an embodiment, a second gate metal line 152 is formed on the second insulation layer 142. The second gate metal line 152 may be formed while overlapping (e.g., partially overlapping) the first gate metal line 151. The first gate metal line 151 and the second gate metal line 152 together form a gate metal line 150. In an embodiment, the second gate metal line 152 may include a metal selected from molybdenum (Mo), a molybdenum alloy, copper (Cu), a copper alloy, aluminum (Al), and an aluminum alloy.

In an embodiment, a third insulation layer 161 covering the second gate metal line 152 is formed. The third insulation layer 161 may include a silicon oxide (SiOx). Then, a fourth insulation layer 162 is formed on the third insulation layer 161. The fourth insulation layer 162 may include a silicon nitride (SiNx). Then, a fifth insulation layer 163 is formed on the fourth insulation layer 162. The fifth insulation layer 163 may include a silicon oxide (SiOx). In this case, the fifth insulation layer 163 may have a first protruding portion 163a at a portion P1, in which the active layer 130 and the first gate metal line 151 overlap. Further, the fifth insulation layer 163 may have a second protruding portion 163b at a portion P2, in which each of the active layer 130, the first gate metal line 151, and the second gate metal line 152 overlap. Transistors may be formed in the portion P1, in which the active layer 130 and the first gate metal line 151 overlap, and in the portion P2, in which each of the active layer 130, the first gate metal line 151, and the second gate metal line 152 overlap. When a line is formed on the first protruding portion 163a and the second protruding portion 163b, a pattern defect is easily generated in the line. Accordingly, in the present exemplary embodiment, the first protruding portion 163a and the second protruding portion 163b are removed by using a polishing process. This will be described in further detail.

Next, as illustrated in FIG. 2, a blocking member 310 is formed on the first protruding portion 163a and the second protruding portion 163b. In the present exemplary embodiment, the blocking member 310 may be a photosensitive film pattern. The blocking member 310 covers only the first protruding portion 163a and the second protruding portion 163b of the fifth insulation layer 163 to protect the fifth insulation layer 163 from the outside. The blocking member 310 that is the photosensitive film pattern may be formed by coating a photosensitive layer on the fifth insulation layer 163, and exposing and developing the photosensitive film by using a photo mask.

Next, as illustrated in FIG. 3, nitrogen ions 10 are doped in the fifth insulation layer 163. In this case, the nitrogen ions 10 are injected into the remaining positions, other than the first protruding portion 163a and the second protruding portion 163b which are at positions corresponding to the blocking member 310, in the fifth insulation layer 163.

Accordingly, as illustrated in FIG. 4, a fifth auxiliary insulation layer 1632 is formed on an upper portion in the fifth insulation layer 163, into which the nitrogen ions 10 are injected. Accordingly, the fifth auxiliary insulation layer 1632 may include a silicon nitride (SiNx). A fifth main insulation layer 1631 is formed in a lower portion in the fifth insulation layer 163, into which the nitrogen ions 10 are not injected. Accordingly, the fifth main insulation layer 1631 may include a silicon oxide (SiOx). The fifth main insulation layer 1631 and the fifth auxiliary insulation layer 1632 together form the fifth insulation layer 163.

The fifth auxiliary insulation layer 1632 is formed by doping the nitrogen ions 10, such that as illustrated in region "A" of FIG. 4, the content of nitrogen is increased from the lower portion to the upper portion inside the fifth auxiliary insulation layer 1632.

Then, as illustrated in FIG. 4, the blocking member 310 is removed. Accordingly, the first protruding portion 163a and the second protruding portion 163b of the fifth main insulation layer 1631, which were hidden by the blocking member 310, are exposed to the outside. In this case, the fifth auxiliary insulation layer 1632 is not positioned at a position corresponding to the blocking member 310. That is, a border 63 of the fifth auxiliary insulation layer 1632 is formed along a position corresponding to the blocking member 310. The fifth auxiliary insulation layer 1632 is not formed in a portion surrounded by a border of the blocking member 310, such that the first protruding portion 163a and the second protruding portion 163b of the fifth main insulation layer 1631 are exposed.

In an embodiment, as illustrated in FIG. 5, the exposed first protruding portion 163a and second protruding portion 163b of the fifth main insulation layer 1631 are removed by performing a polishing process by using a polishing device CMP (see FIG. 6), which performs the chemical mechanical polishing process.

Herein, a particular structure of a polishing device, according to an embodiment, will be described in further detail with reference to FIG. 6.

As illustrated in FIG. 6, in an embodiment, the polishing device CMP includes a polishing part 50, which polishes a target P while rotating, and a polishing adjusting part 60, which measures a change in frictional force of the polishing part 50 and adjusts a rotation speed of the polishing part 50. The polishing part 50 includes a first polishing part 20 and a second polishing part 30 which face each other. The target P is positioned on the second polishing part 30. The first polishing part 20 and the second polishing part 30 polish a surface of the target P, which is interposed between the first polishing part 20 and the second polishing part 30, while rotating with respect to each other. In an embodiment, a slurry 51 is supplied to the surface of the target P by using a nozzle 40, for example. The slurry 51 is a material for easily polishing the target P.

The target P illustrated in FIG. 6 corresponds to the display device 100 illustrated in FIG. 5. For convenience of description, FIG. 5 illustrates only the first polishing part 20 of the polishing device CMP.

Referring to FIG. 6 together with FIG. 5, the first protruding portion 163a and the second protruding portion 163b are removed by applying the slurry 51 onto surfaces of the fifth main insulation layer 1631 and the fifth auxiliary insulation layer 1632, and polishing the fifth main insulation layer 1631, onto which the slurry 51 is applied, by rotating the first polishing part 20 of the polishing device CMP.

The slurry 51 may include abrasives polishing the fifth main insulation layer 1631, a polishing inhibitor inhibiting the polishing of the fifth auxiliary insulation layer 1632 including a silicon nitride, a dispersant for dispersing the abrasives, a dispersion stabilizer for helping the dispersion of the abrasives, and a pH regulator. The abrasives may include any of silica ($SiO_2$) or ceria ($CeO_2$), alumina ($Al_2O_3$), zirconia ($ZrO_2$), a tin oxide ($SnO_2$), and a manganese oxide ($MnO_2$).

The abrasives included in the slurry 51 help the first polishing part 20 more easily polish the fifth main insulation layer 1631.

After the first protruding portion 163a and the second protruding portion 163b are removed by polishing the fifth main insulation layer 1631, the first polishing part 20 continuously polishes the fifth main insulation layer 1631 and exposes a part of an upper surface 162a of the fourth insulation layer 162. In an embodiment, the fourth insulation layer 162 is a layer, which is formed of the same silicon nitride as that of the fifth auxiliary insulation layer 1632, such that the polishing is inhibited. Accordingly, an upper surface 1631a of the fifth main insulation layer 1631 is positioned on the same horizontal surface as that of the exposed upper surface 162a of the fourth insulation layer 162. The fifth insulation layer 163, of which the upper surface is planarized, is formed through the polishing process.

If the fifth auxiliary insulation layer 1632 is not formed on the fifth main insulation layer 1631, the fourth insulation layer 162 including a silicon nitride is not polished, but the fifth main insulation layer 1631 including a silicon oxide may be excessively polished, such that a recess may be formed in the fifth main insulation layer 1631. However, in the present exemplary embodiment, the fifth auxiliary insulation layer 1632 is formed on the fifth main insulation layer 1631 to prevent or substantially prevent the fifth main insulation layer 1631 from being excessively polished. Accordingly, the fifth main insulation layer 1631 may be planarized.

Accordingly, as illustrated in FIG. 7, distances from an upper surface 110a of the substrate 110 to upper surfaces 1631a and 1632a of the fifth insulation layer 163 are the same in all of the regions of the fifth insulation layer 163. That is, a distance h1 from the upper surface 110a of the substrate 110 to the upper surface 1631a of the fifth main insulation layer 1631 is the same as a distance h2 from the upper surface 110a of the substrate 110 to the upper surface 1632a of the fifth auxiliary insulation layer 1632.

A thickness t2 of the fifth auxiliary insulation layer 1632 including a silicon nitride may be smaller than a thickness t1 of the fourth insulation layer 162 including a silicon nitride. In an embodiment, the thickness t2 of the fifth auxiliary insulation layer 1632 may be 20 nm to 30 nm. If the thickness t2 of the fifth auxiliary insulation layer 1632 is smaller than 20 nm, it is difficult for the fifth auxiliary insulation layer 1632 to prevent the fifth main insulation layer 1631 from being excessively polished. Further, if the thickness t2 of the fifth auxiliary insulation layer 1632 is larger than 30 nm, a doping process time is increased, such that a manufacturing process time is increased.

In an embodiment, as illustrated in FIG. 8, a data metal line 171 is formed on the fifth insulation layer 163 including the fifth main insulation layer 1631 and the fifth auxiliary insulation layer 1632. The data metal line 171 may be formed in multiple layers, in which metal layers including any of aluminum (Al), an aluminum alloy, molybdenum (Mo), a molybdenum alloy, copper (Cu), and a copper alloy, are laminated, and, for example, may be formed of triple layers of titanium/aluminum/titanium (Ti/Al/Ti), triple layers of molybdenum/aluminum/molybdenum (Mo/Al/Mo), or triple layers of molybdenum/copper/molybdenum (Mo/Cu/Mo). In this case, before the data metal line 171 is formed, the fifth insulation layer 163 is planarized, such that the data metal line 171 positioned on the fifth insulation layer 163 may be formed without a step. Accordingly, it is possible to easily pattern the data metal line 171.

After the data metal line 171 is formed, a passivation layer 180 covering the data metal line 171 is formed. The passivation layer 180 may include an organic material, such as any of a polyacryl-based resin and a polyimide-based resin, a laminated layer of an organic material and an inorganic material, or the like. Then, a pixel electrode 710 that is a first electrode is formed on the passivation layer 180. The pixel electrode 710 may be formed of a transparent conductive material, such as an indium tin oxide (ITO), an indium zinc oxide (IZO), a zinc oxide (ZnO), or an indium oxide ($In_2O_3$), or a reflective metal, such as lithium (Li), calcium (Ca), fluorolithium/calcium (LiF/Ca), fluorolithium/aluminum (LiF/Al), aluminum (Al), silver (Ag), magnesium (Mg), or gold (Au).

Then, a pixel defining layer 350 is formed on the passivation layer 180 and a border of the pixel electrode 710. The pixel defining layer 350 has a pixel opening 351 overlapping the pixel electrode 710. A light emitting member 720 is formed in the pixel opening 351 of the pixel defining layer 350. The light emitting member 720 may be formed of multiple layers including one or more of an emission layer, a hole injection layer HIL, a hole transport layer HTL, an electron transport layer ETL, and an electron injection layer EIL. The emission layer may be an organic material or an inorganic material. In a case in which the light emitting member 720 includes all of the above layers, the hole injection layer may be disposed on the pixel electrode 710 that is an anode electrode, and the hole transport layer, the emission layer, the electron transport layer, and the electron injection layer may be sequentially laminated thereon.

Then, a common electrode 730 that is a second electrode is formed on the pixel defining layer 350 and the light emitting member 720. The common electrode 730 may be formed of a transparent conductive material, such as an indium tin oxide (ITO), an indium zinc oxide (IZO), a zinc oxide (ZnO), or an indium oxide ($In_2O_3$), or a reflective metal, such as lithium (Li), calcium (Ca), fluorolithium/calcium (LiF/Ca), fluorolithium/aluminum (LiF/Al), aluminum (Al), silver (Ag), magnesium (Mg), or gold (Au). The common electrode 730 becomes a cathode electrode of an organic light emitting diode OLED. The pixel electrode 710, the light emitting member 720, and the common electrode 730 form the organic light emitting diode OLED.

Herein, a display device manufactured by using a method of manufacturing the display device according to an exemplary embodiment will be described in further detail with reference to FIG. 9 together with FIG. 8.

Figure 9:
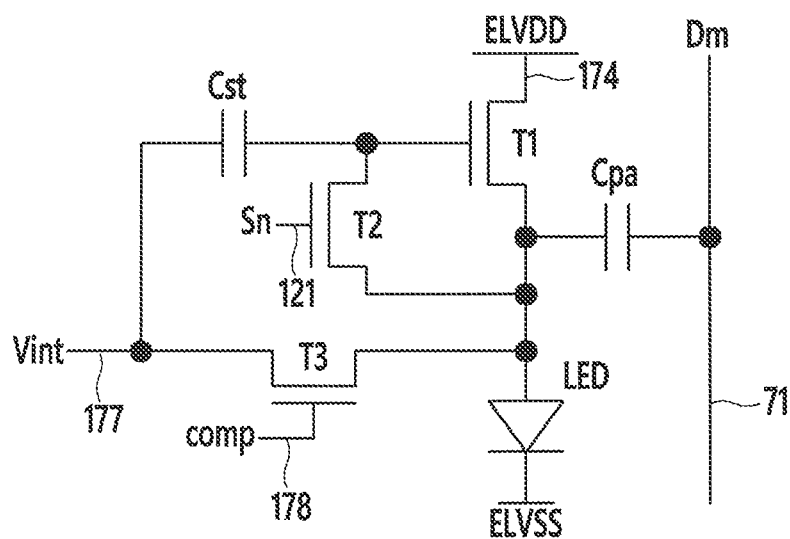
FIG. 9 is an equivalent circuit diagram of a pixel of the display device of FIG. 8.

FIG. 9 is an equivalent circuit diagram of a pixel of the display device according to an exemplary embodiment.

First, referring to FIG. 9, one pixel of the display device according to the exemplary embodiment includes a driving transistor T1, a switching transistor T2, a compensation transistor T3, a storage capacitor Cst, a parasitic capacitor Cpa, and a light emitting diode LED. Then, a scan line 121 transmitting a scan signal Sn, a data line 71 transmitting a data signal Dm, and a driving voltage line 174 transmitting a driving voltage ELVDD are connected to one pixel.

The first gate metal line 151 or the second gate metal line 152 may include the scan line 121, and a first data metal line or a second data metal line of the data metal line 171 may include the data line 71 and the driving voltage line 174.

The driving transistor T1 includes a control terminal, an input terminal, and an output terminal, and the control terminal thereof is connected to the switching transistor T2, the input terminal thereof is connected to the driving voltage line 174, and the output terminal thereof is connected to the light emitting diode LED. The driving transistor T1 allows an output current Id, of which a size is changed according to a voltage applied between the control terminal and the output terminal, to flow.

The switching transistor T2 includes a control terminal, an input terminal, and an output terminal and the control terminal thereof is connected to the scan line 121, the input terminal thereof is connected to the data line 71, and the output terminal thereof is connected to the driving transistor T1. The switching transistor T2 transmits the data signal Dm applied to the data line 71 to the driving transistor T1 in response to the scan signal Sn applied to the scan line 121.

The compensation transistor T3 includes a control terminal, an input terminal, and an output terminal and the control terminal thereof is connected to a compensation control line comp, the input terminal thereof is connected to an initialization voltage line 177, and the output terminal thereof is connected to the driving transistor T1.

The storage capacitor Cst is connected between the control terminal of the driving transistor T1 and the initialization voltage line 177. The storage capacitor Cst charges the data signal applied to the control terminal of the driving transistor T1 and maintains the data signal even after the switching transistor T2 is turned off.

The light emitting diode LED includes an anode connected to the output terminal of the driving transistor T1 and a cathode connected to the common voltage ELVSS. The light emitting diode LED displays an image by emitting light while changing the intensity thereof according to the output current Id of the driving transistor T1.

However, a connection relationship of the transistors T1, T2, and T3, the storage capacitor Cst, the parasitic capacitor Cpa, and the light emitting diode LED may be changed.

In the exemplary embodiment, the structure including the three transistors and the two capacitors is illustrated, but the present disclosure is not limited thereto, and the numbers of transistors and capacitors may be variously changed.

Herein, a structure of the pixel of the display device illustrated in FIG. 9 will be described with reference back to FIG. 8 together with FIG. 9.

Referring back to FIG. 8, the active layer 130 is positioned on the substrate 110 of the display device. The substrate 110 may include an insulative substrate formed of glass, quartz, ceramic, or plastic, for example. The active layer 130 may include a polycrystalline silicon layer. The first insulation layer 141 is positioned on the active layer 130. Further, the first gate metal line 151 is formed on the first insulation layer 141. A wire, which is positioned while overlapping the active layer 130, in the first gate metal line 151 may be a gate electrode.

The second insulation layer 142 covering the first gate metal line 151 is positioned on the first gate metal line 151. The second gate metal line 152 is formed on the second insulation layer 142. The second gate metal line 152 may be formed while partially overlapping the first gate metal line 151.

The third insulation layer 161 covering the second gate metal line 152 is positioned on the second gate metal line 152. The fourth insulation layer 162 covering the third insulation layer 161 is positioned on the third insulation layer 161. The fourth insulation layer 162 may include a silicon nitride (SiNx). Then, the fifth main insulation layer 1631 is positioned on the fourth insulation layer 162. The fifth main insulation layer 1631 may include a silicon oxide (SiOx). The fifth auxiliary insulation layer 1632 is positioned on the fifth main insulation layer 1631. The fifth auxiliary insulation layer 1632 may not be positioned in the portion P1, in which the active layer 130 and the first gate metal line 151 overlap. Further, the fifth auxiliary insulation layer 1632 may not be positioned in the portion P2, in which the active layer 130, the first gate metal line 151, and the second gate metal line 152 overlap.

In this case, the upper surface 1631a of the fifth main insulation layer 1631 is positioned on the same horizontal surface as that of the exposed upper surface 162a of the fourth insulation layer 162. The fifth insulation layer 163 including the fifth main insulation layer 1631 and the fifth auxiliary insulation layer 1632 is planarized.

Then, the data metal line 171 is positioned on the fifth insulation layer 163. As described above, the fifth insulation layer 163 is planarized, such that the data metal line 171 positioned on the fifth insulation layer 163 does not have a step. The data metal line 171 may include the data line 71 and a source electrode 173 or a drain electrode 175. The source electrode 173 and the drain electrode 175 are connected to the active layer 130.

Then, the passivation layer 180 covering the data metal line 171 is positioned on the data metal line 171. The passivation layer 180 may be in contact with the fifth main insulation layer 1631, in which the fifth auxiliary insulation layer 1632 is not positioned.

The pixel electrode 710 is positioned on the passivation layer 180. The pixel electrode 710 is electrically connected with the drain electrode 175. The pixel defining layer 350 is formed on the passivation layer 180 and a border of the pixel electrode 710. The pixel defining layer 350 has the pixel opening 351 overlapping the pixel electrode 710. The light emitting member 720 is formed in the pixel opening 351 of the pixel defining layer 350. The common electrode 730 is positioned on the pixel defining layer 350 and the light emitting member 720.

In an exemplary embodiment, the blocking member is formed with the photosensitive film pattern, but, in another exemplary embodiment, a blocking member is formed with a shadow mask.

Herein, a method of manufacturing a display device according to another exemplary embodiment will be described in detail with reference to FIG. 10.

Figure 10:
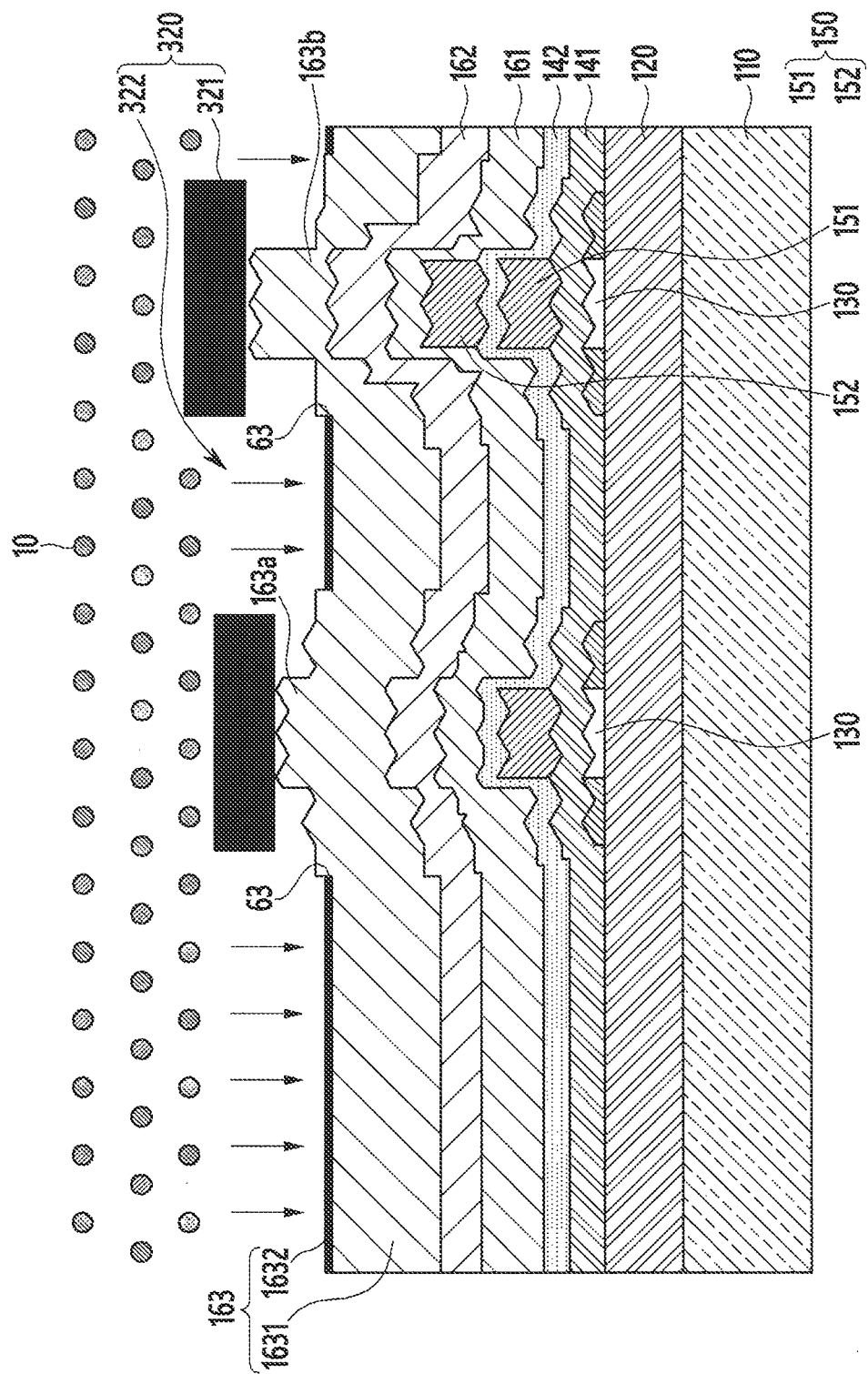
FIG. 10 is a cross-sectional view illustrating an operation of a method of manufacturing a display device according to another exemplary embodiment.

FIG. 10 is a cross-sectional view illustrating an operation of a method of manufacturing a display device according to another exemplary embodiment.

The exemplary embodiment illustrated in FIG. 10 is substantially the same as the exemplary embodiment illustrated in FIGS. 1 to 8, except for a structure of a blocking member, and repeated descriptions will be omitted.

As illustrated in FIG. 10, in a method of manufacturing the display device according to another exemplary embodiment, a blocking member 320 is positioned on the first protruding portion 163a and the second protruding portion 163b of the fifth insulation layer 163, similar to the aforementioned exemplary embodiment. In the present exemplary embodiment, the blocking member 320 may be a shadow mask. In an embodiment, the blocking member 320 includes a blocking part 321 formed of a metal material, and a transmissive part 322, through which nitrogen ions 10 pass. The blocking parts 321 of the blocking member 320 are positioned so as to correspond to the first protruding portion 163a and the second protruding portion 163b of the fifth insulation layer 163.

Then, the nitrogen ions 10 are doped in the fifth insulation layer 163. In this case, the nitrogen ions 10 are injected into the remaining positions, except for only the first protruding portion 163a and the second protruding portion 163b at a position blocked by the blocking parts 321 of the blocking member 320 in the fifth insulation layer 163.

Accordingly, a fifth auxiliary insulation layer 1632 is formed on an upper portion inside the fifth insulation layer 163, into which the nitrogen ions 10 are injected. Accordingly, the fifth auxiliary insulation layer 1632 may include a silicon nitride (SiNx). A fifth main insulation layer 1631 is formed in a lower portion inside the fifth insulation layer 163, into which the nitrogen ions 10 are not injected. Accordingly, the fifth main insulation layer 1631 may include a silicon oxide (SiOx). The fifth main insulation layer 1631 and the fifth auxiliary insulation layer 1632 together form the fifth insulation layer 163. As described above, the fifth main insulation layer 1631 is prevented or substantially prevented from being excessively polished by forming the fifth auxiliary insulation layer 1632 on the fifth main insulation layer 1631, thereby planarizing the fifth main insulation layer 1631.

What claimed is:

1. A display device comprising:
   a substrate;
   an active layer on the substrate;
   a first insulation layer covering the active layer;
   a first gate metal line positioned on the first insulation layer;
   a second insulation layer covering the first gate metal line;
   a second gate metal line positioned on the second insulation layer and overlapping the first gate metal line;
   a third insulation layer covering the second gate metal line and including a silicon oxide;
   a fourth insulation layer positioned on the third insulation layer and including a silicon nitride;
   a fifth main insulation layer positioned on the fourth insulation layer and including a silicon oxide; and
   a fifth auxiliary insulation layer, which is positioned on a part of the fifth main insulation layer and includes a silicon nitride,
   wherein an upper surface of the fifth main insulation layer is positioned on a same horizontal surface as that of a part of an upper surface of the fourth insulation layer, and
   wherein the fifth auxiliary insulation layer is not positioned over a region in which the active layer, the first gate metal line, and the second gate metal line overlap.

2. The display device of claim 1, wherein a thickness of the fifth auxiliary insulation layer is less than a thickness of the fourth insulation layer.

3. The display device of claim 1, wherein a content of nitrogen is increased from a lower portion to an upper portion inside the fifth auxiliary insulation layer.

4. The display device of claim 1, wherein a distance from an upper surface of the substrate to an upper surface of the fifth main insulation layer is the same as a distance from the upper surface of the substrate to an upper surface of the fifth auxiliary insulation layer.

5. The display device of claim 1, further comprising:
   a data metal line positioned on the fifth auxiliary insulation layer;
   a passivation layer covering the data metal line;
   a first electrode positioned on the passivation layer;
   an emission layer positioned on the first electrode; and
   a second electrode formed on the emission layer,
   wherein the passivation layer is in contact with the fifth main insulation layer, in which the fifth auxiliary insulation layer is not positioned.

* * * * *